United States Patent [19]
Wilson

[11] Patent Number: 5,966,803
[45] Date of Patent: Oct. 19, 1999

[54] BALL GRID ARRAY HAVING NO THROUGH HOLES OR VIA INTERCONNECTIONS

[75] Inventor: James Warren Wilson, Vestal, N.Y.

[73] Assignee: International Business Machines Corporation, Armonk, N.Y.

[21] Appl. No.: 08/854,795

[22] Filed: May 12, 1997

Related U.S. Application Data

[62] Division of application No. 08/657,920, May 31, 1996.

[51] Int. Cl.$^6$ ..................................................... H05K 3/32
[52] U.S. Cl. ................................. 29/840; 29/843; 29/846; 29/852; 29/DIG. 12
[58] Field of Search ............................. 29/840, 843, 846, 29/852, DIG. 12; 429/99; 504/192.14

[56] References Cited

U.S. PATENT DOCUMENTS

| | | | |
|---|---|---|---|
| 4,351,704 | 9/1982 | Kurihara . | |
| 4,517,051 | 5/1985 | Gazdik et al. | 204/192.14 X |
| 5,191,511 | 3/1993 | Sawaya | 361/383 |
| 5,209,817 | 5/1993 | Ahmad et al. . | |
| 5,216,806 | 6/1993 | Lam . | |
| 5,309,326 | 5/1994 | Minoru | 361/790 |
| 5,340,771 | 8/1994 | Rostoker | 437/209 |
| 5,355,283 | 10/1994 | Marrs et al. | 361/760 |
| 5,376,588 | 12/1994 | Pendse . | |
| 5,397,921 | 3/1995 | Karnezos | 257/779 |
| 5,409,865 | 4/1995 | Karnezos | 437/210 |
| 5,420,460 | 5/1995 | Massingill . | |
| 5,583,378 | 12/1996 | Marrs et al. . | |
| 5,615,477 | 4/1997 | Sweitzer | 29/840 |

FOREIGN PATENT DOCUMENTS 7-321250  5/1995  Japan .

OTHER PUBLICATIONS

IBM Technical Disclosure Bulletin vol. 32, No. 10A, Mar. 1990, "Thin Film Substrate For Wire Bonding".

*Primary Examiner*—Lee Young
*Assistant Examiner*—Rick Kiltae Chang
*Attorney, Agent, or Firm*—Pollock, Vande Sande & Amernick; Lawrence R. Fraley

[57] ABSTRACT

An electronic device package in the form of a ball grid array package is formed adding a single layer of conductive material including circuitry having trace lines, wire bond pads, and solder ball pads electrically coupled together. Thin film circuitization techniques are used on a polyimide laminate substrate to accommodate greater than 100 input/output contacts of an electronic device on a single layer. Thus, the package will not have vias or other conductive type through holes as in multiple conductive layer ball grid array packages.

19 Claims, 9 Drawing Sheets

BALL GRID ARRAY HAVING NO THROUGH HOLES OR VIA INTERCONNECTIONS

This application is a division of application Ser. No. 08/657,920, filed May 31, 1996 pending.

FIELD OF THE INVENTION

This invention relates to methods and apparatuses for packaging an electronic device, such as an integrated circuit, using a ball grid array requiring no through holes or via interconnections.

BACKGROUND OF THE INVENTION

With the increase in the number of input/output leads extending from electronic devices, such as integrated circuits, ball grid array (BGA) packages have been developed. A BGA package is a type of packaged electronic device in which at least one electronic device, such as an integrated circuit chip, is mounted to a substrate and an electrical connection to an electrically conductive material not part of the packaged electronic device, such as a printed circuit board (PCB), is made by an array of solder balls located on a surface of the substrate.

Current PCB technology used to manufacture BGA packages produce conductive trace lines having widths in the order of 3 mils or more. This trace line width limitation limits the number of input/output leads for each layer of conductive material attached to the BGA substrate. Thus, electronic devices requiring more than 100 input/output leads require multiple layers of conductive material wherein each layer must be electrically coupled together. This, in turn, requires creating through holes and/or vias to interconnect each conductive layer. For examples of BGA packages having multiple conductive layers and either through holes or vias, see U.S. Pat. No. 5,355,283.

Through hole drilling and/or via creation is one of the most expensive PCB operations. Each layer of interconnection increases the cost to the PCB. In addition, circuits which must travel across one layer, down a through hole, and back across another layer are much poorer in electrical performance than circuits which can travel directly across a single layer. Thin film circuitization processes such as vacuum metallization have been used to produce conductive traces having widths less than that which can be achieved using electroplating processes.

One of the keys to thin film circuitization technology is to deposit the conductive material on the substrate by evaporation or sputtering. Sputtering or evaporation can deposit very thin, uniform conductive material layers which, when used in combination with thin resists, can be defined to achieve traces having widths in the order of 1 mil. The limitation of sputtering and evaporation is that they are very hot processes. The substrate upon which the conductive material is deposited often reaches temperatures of 500 degrees Celsius. The substrate for thin film circuitization, therefore, is usually a high temperature material such as ceramic. Thin films of polyimide have also been used in combination with sputtered metal films and subtractive circuitization to produce multiple layers of thin film circuitry.

What is needed is a BGA package with a single layer of circuitry, such as conductive traces, wire bond pads, and solder ball pads having trace lines less than 1 mil in width so as to accommodate an electronic device having more than 100 input/output leads. Such a ball grid array package can be formed by using thin film circuitization processes such as vacuum metallization.

SUMMARY OF THE INVENTION

Accordingly, the present invention is directed to a method of packaging an electronic device comprising the steps of: providing a substrate having a first surface and an opposed second surface; forming a single layer of electrically conductive circuitry on the first surface of the substrate; providing an opening in the substrate; securing a thermally conductive member to the second surface of the substrate; securing the electronic device to the thermally conductive member such that the electronic device is positioned within the opening in the substrate; and electrically coupling the electronic device to the circuitry.

The present invention is also directed to a packaged electronic device comprising a substrate having a first surface and an opposed second surface; a single layer of electrically conductive circuitry vacuum metallized on the first surface. The substrate includes an opening, and a thermally conductive member secured to the second surface is provided. The electronic device is secured to the thermally conductive member such that the electronic device is positioned substantially within the opening in the substrate, and the electronic device is electrically coupled to the circuitry.

The primary advantage of the present invention is the elimination of through hole and via interconnections.

Another advantage of the present invention is lower production costs and improved electrical performance of the electronic device due the elimination of drilled and plated through hole connections and vias.

DETAILED DESCRIPTION OF A PREFERRED EMBODIMENT

Figure 1:
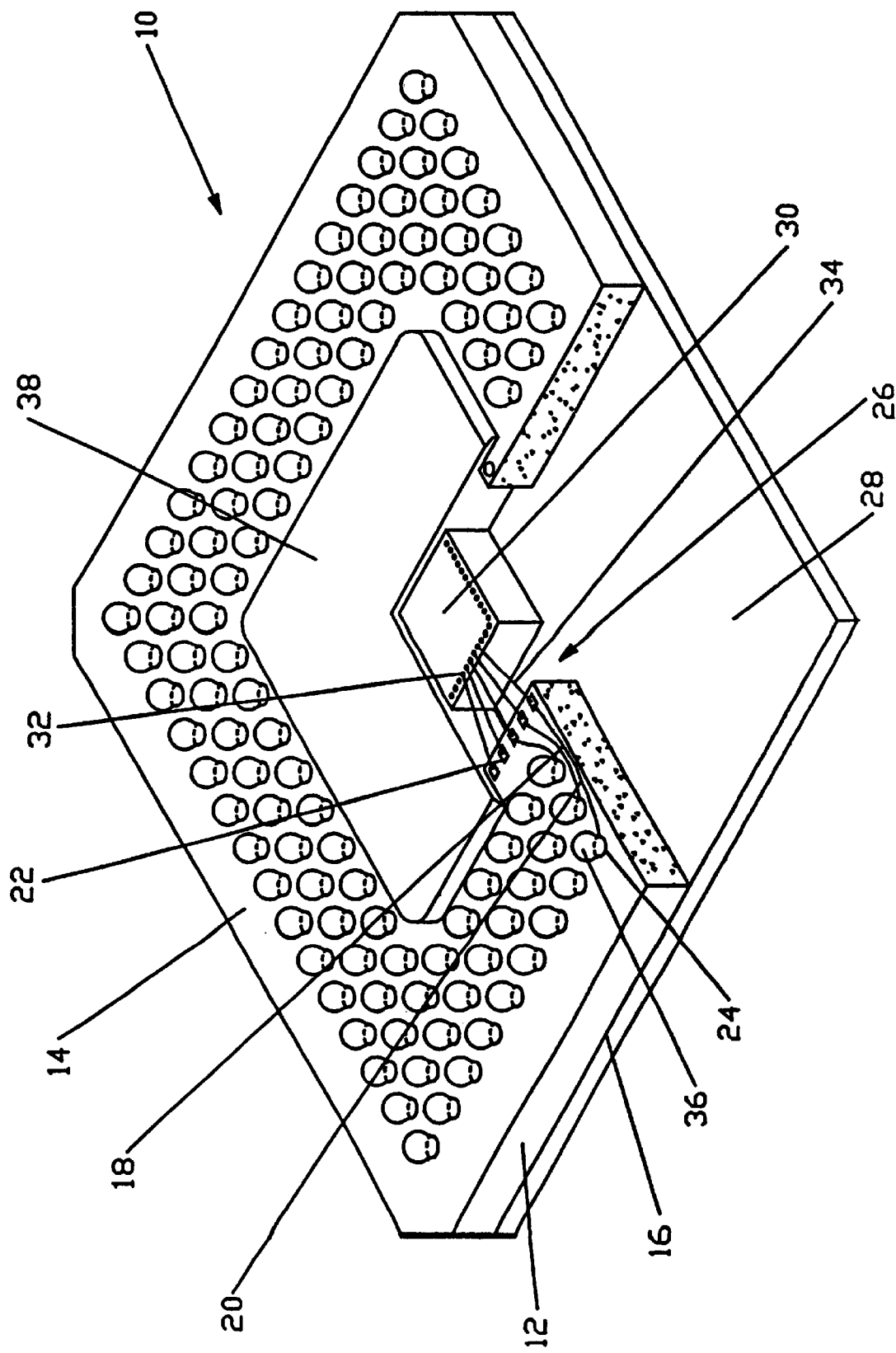
FIG. 1 is a partial cut-out view of a BGA package according to the present invention.
Figure 2:
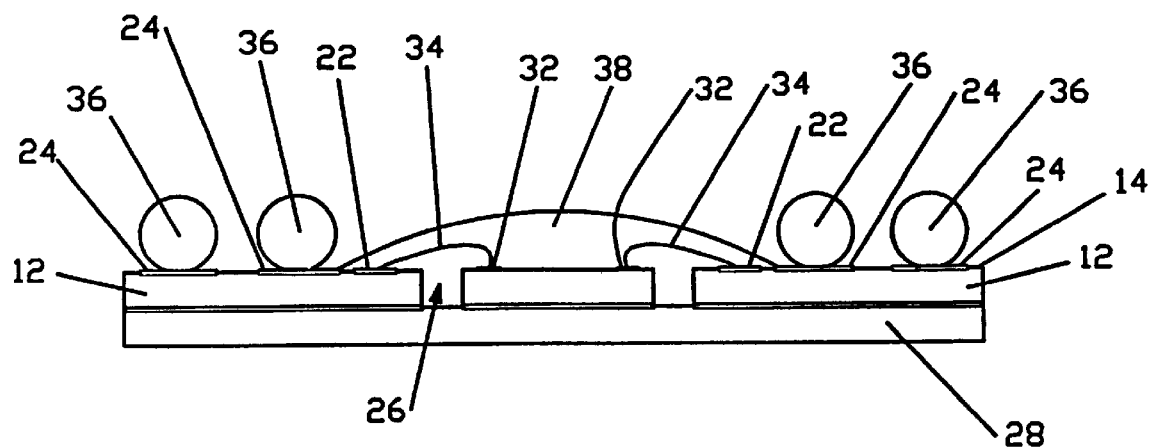
FIG. 2 is a cross-sectional view of the BGA package of FIG. 1.

Referring to FIGS. 1 and 2, an electronic device package 10 according to the invention is shown. The electronic device package 10 is also known as a ball grid array (BGA) package. Electronic device package 10 includes a substrate 12 having a first surface 14 and an opposed second surface 16. Substrate 12 is a dielectric material, i.e., a nonelectically conductive material, made of an organic material such as, but not limited, to a polyimide laminate, epoxy laminate, or cyanate laminate. However, a polyimide laminate approximately 15 mil thick is preferred for substrate 12. The polyimide laminate consists of polyimide resin and reinforcing material, such as glass cloth, and may also have a copper plane or planes for reinforcement and/or for electrical performance enhancement, i.e., a floating ground plane. Electronic device package 10 further includes a single layer of electrically conductive material or circuitry 18 vacuum metallized on first surface 14. Electrically conductive layer 18 includes the following circuitry electrically coupled together: trace lines 20, wire bond pads 22, and solder ball pads 24. Substrate 12 includes an opening 26. Package 10 further includes a thermally conductive member 28 secured to second surface 16 of substrate 12. Thermally conductive member 28 has a thickness of typically 0.010 inches but may be thicker or thinner to achieve necessary thermal dissipation.

In the preferred embodiment, thermally conductive member 28 is made from copper. Thermally conductive member 28 dissipates heat and is sometimes referred to as a heat spreader. A thermally resistive adhesive is used to secure thermally conductive member 28 to substrate 12. An electronic device 30 is secured to thermally conductive member 28 such that electronic device 30 is positioned substantially within opening 26 in substrate 12. Electronic device 30 may be any electrical based component, such as an integrated circuit and/or semiconductor die having contacts 32. In the preferred embodiment, electronic device 30 has greater than 100 contacts 32. Electrically conductive bond wires 34 are wire bonded to contacts 32 of electronic device 30 at one end and to wire bond pads 22 at the opposite end to electrically couple contacts 32 to wire bond pads 22. Electronic device 30 is secured to thermally conductive member 28 using a thermally resistive adhesive. Package 10 further includes a solder ball 36 electrically coupled to each solder ball pad 24. Package 10 further includes an encapsulant 38 which covers electronic device 30, opening 26, and wire bond pads 22 on first surface 14 to hermetically seal electronic device 30 between thermally conductive member 28 and encapsulant 38.

Single layer of electrically conductive material 18 including trace lines 20, wire bond pads 22, and solder pads 24 comprise a first Cr deposit on first surface 14, a Cu deposit over the first Cr deposit, and a second Cr deposit over the Cu deposit to form a single integral Cr/Cu/Cr layer on first surface 14. The thickness of single layer 18 is preferably less than 0.5 mils. The width of trace lines 20 is preferably less than 1 mil as can be achieved by using thin film circuitization processes, such as vacuum metallization and subtractive circuitization techniques, as are well known in the printed circuit board manufacturing art. Spacing between trace lines 20 is approximately 1 mil. In this manner, package 10 having a footprint or substrate 12 size ranging from width of 15 mm to 50 mm by length of 15 mm to 50 mm can have an electronic device 30 having more than 100 input/output leads or contacts 32 using only a single layer of circuitry 18 such that no through holes or vias are required.

Figure 3:
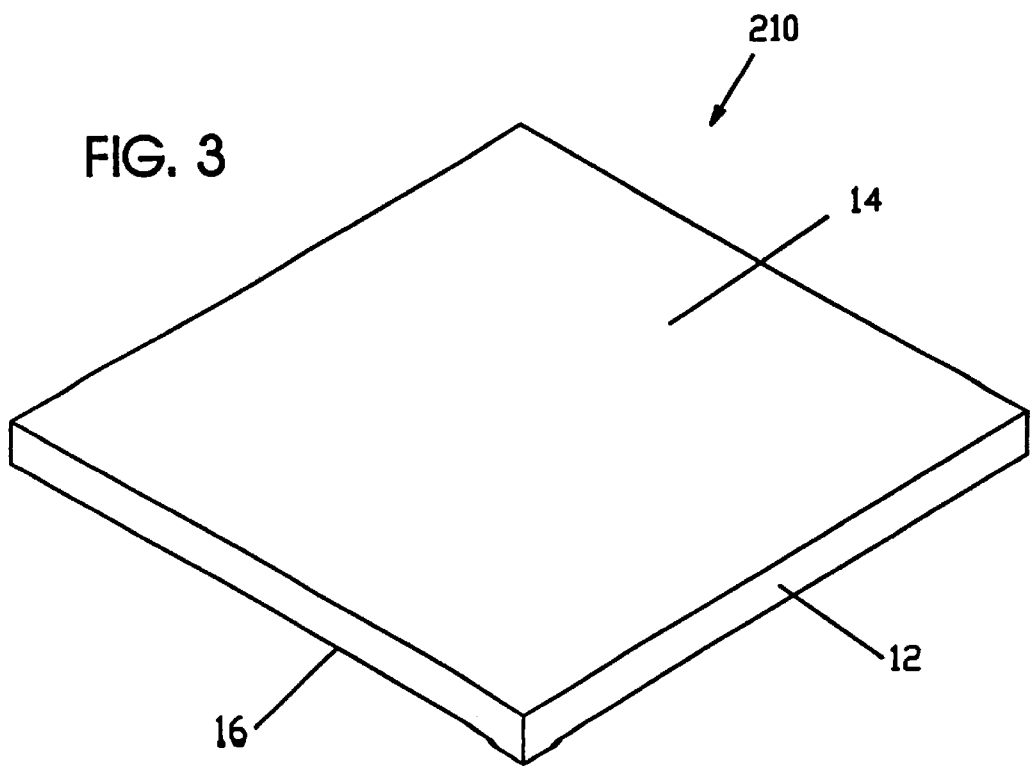
FIGS. 3–10 summarize the steps in a method of packaging an electronic device according to the present invention.
Figure 4:
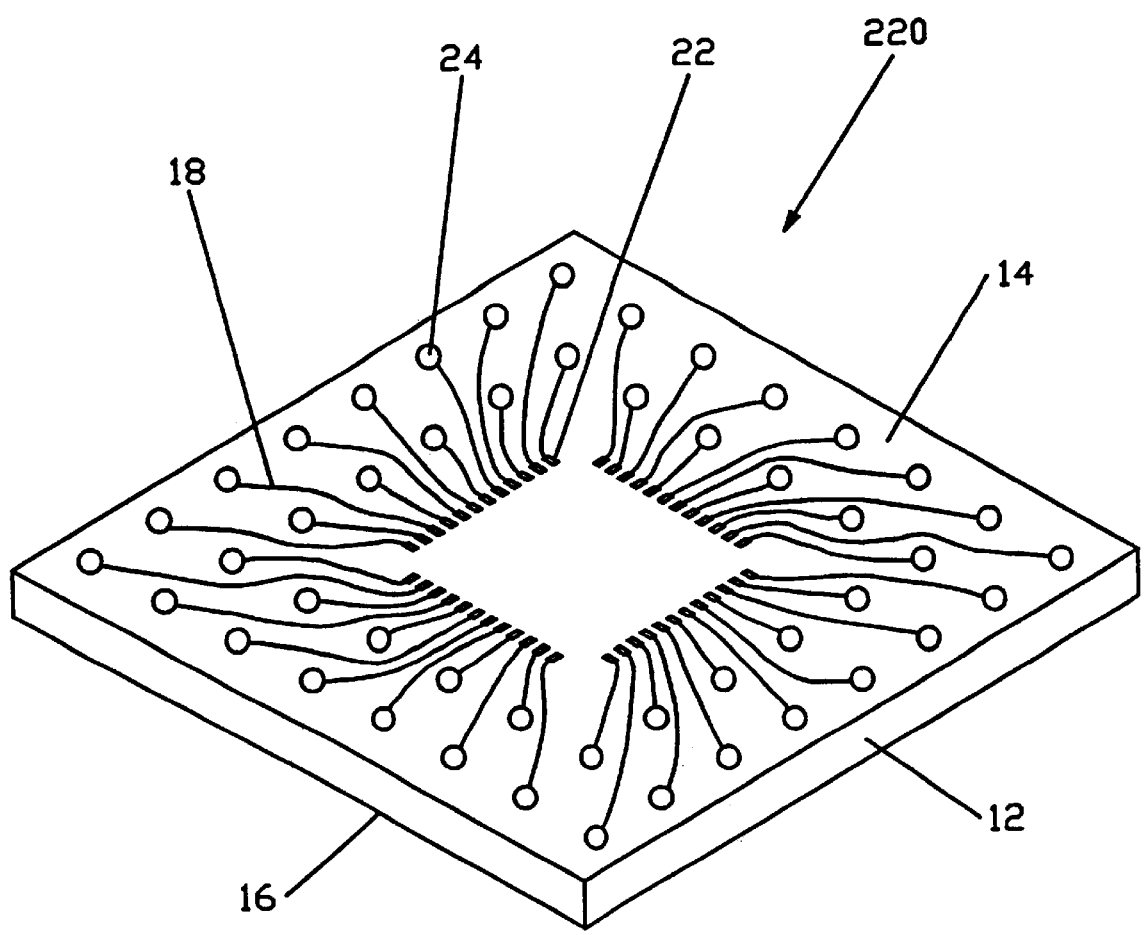

Referring now to FIGS. 3–9, a method of packaging an electronic device 30 according to the present invention is illustrated. The reference numerals used in FIGS. 3–10, which are like or similar to the reference numerals used in FIGS. 1 and 2, are intended to indicate like or similar components. In step 210, a substrate 12 having a first surface 14 and an opposed second surface 16 are provided as illustrated in FIG. 3. In step 220 (FIG. 4), a single layer of electrically conductive material or circuitry 18 is formed on the first surface 14 of substrate 12. The single layer of electrically conductive material includes trace lines 20, wire bond pads 22, and solder ball pads 24. Step 220 includes the step of depositing an electrically conductive material 18 on first surface 14 of substrate 12 using a vacuum metallization process and then removing sections of the electrically conductive material to form trace lines 20, solder ball pads 24, and wire bond pads 22. The trace lines 20, solder ball pads 24, and wire bond pads 22 are formed such that each are electrically coupled to each other. The removal of electrically conductive material may utilize resists and an etching process or subtractive circuitization techniques well known in the art. In this manner, step 220 includes the step of forming trace lines having a width less than 1 mil. Additionally, step 220 includes the step of forming a single layer of circuitry 18 having a thickness less than 0.5 mil. Step 220 may include depositing additional electrically conductive material using an electroplating process to increase the thickness of the electrically conductive material deposited by a vacuum metallization process.

Step 220 further includes the steps of sputtering a first Cr deposit on first surface 14, sputtering a Cu deposit over the first Cr deposit, and sputtering a second Cr deposit over the Cu deposit to form a single integral Cr/Cu/Cr layer on first surface 14. Step 210 further includes the step of providing a substrate 12 made of organic material and preferably a polyimide laminate material.

Figure 5:
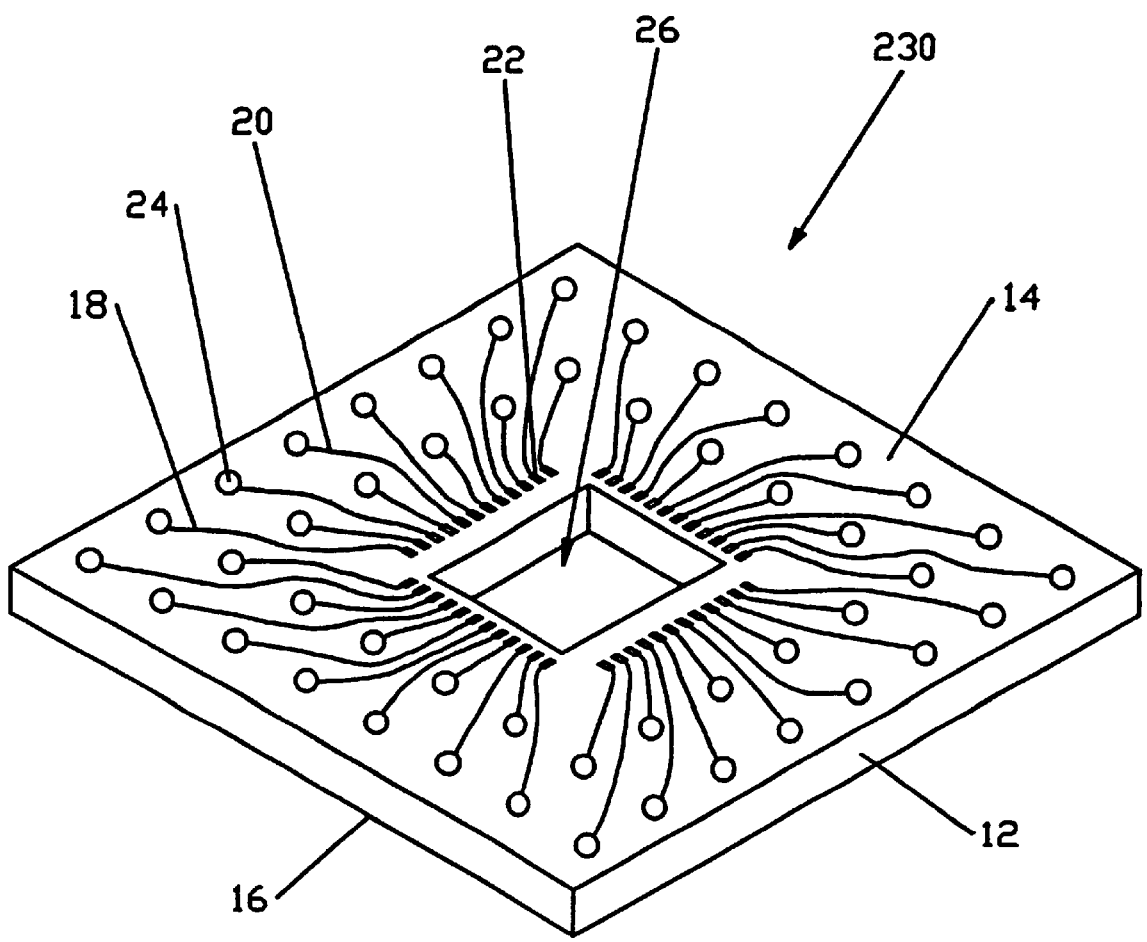
Figure 6:
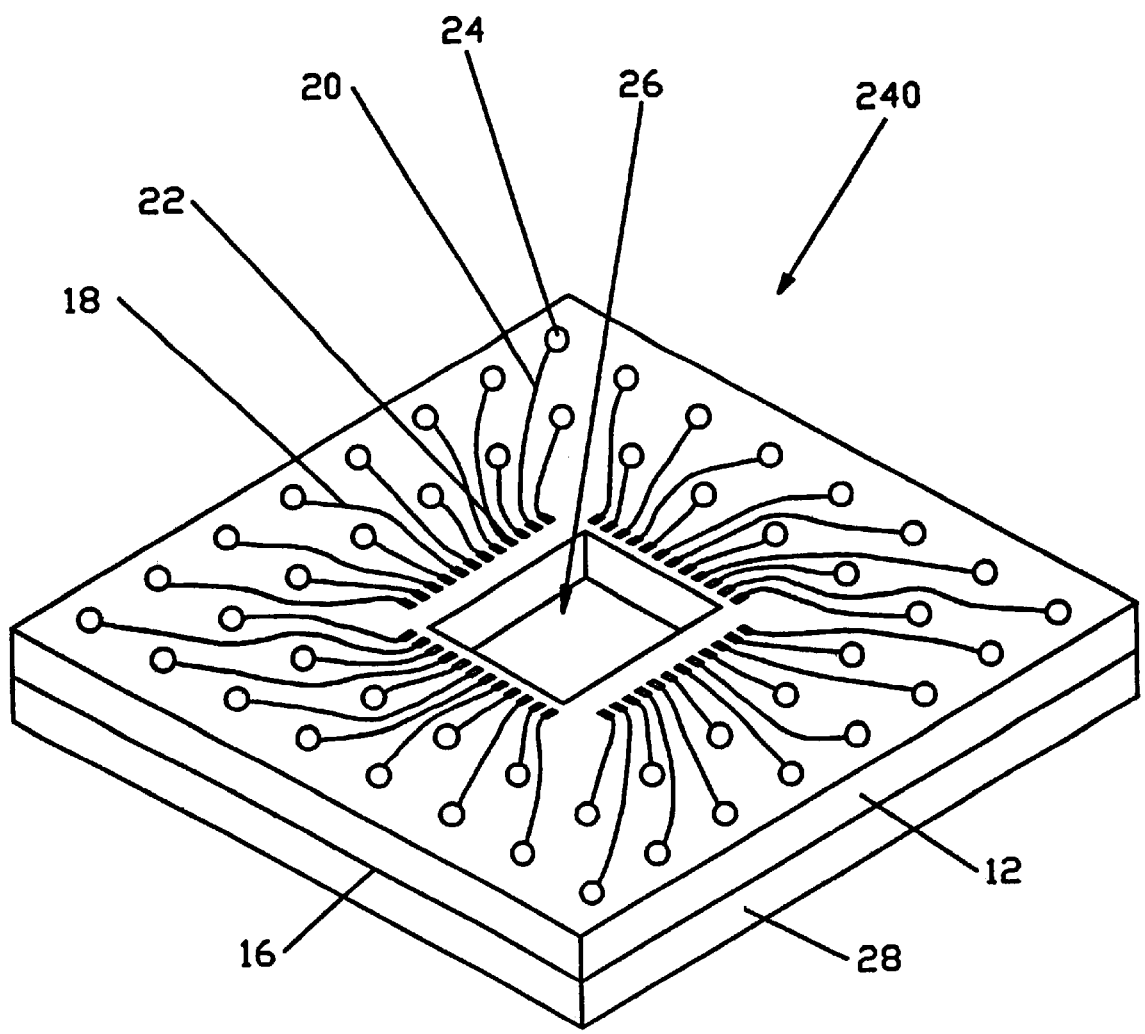
Figure 7:
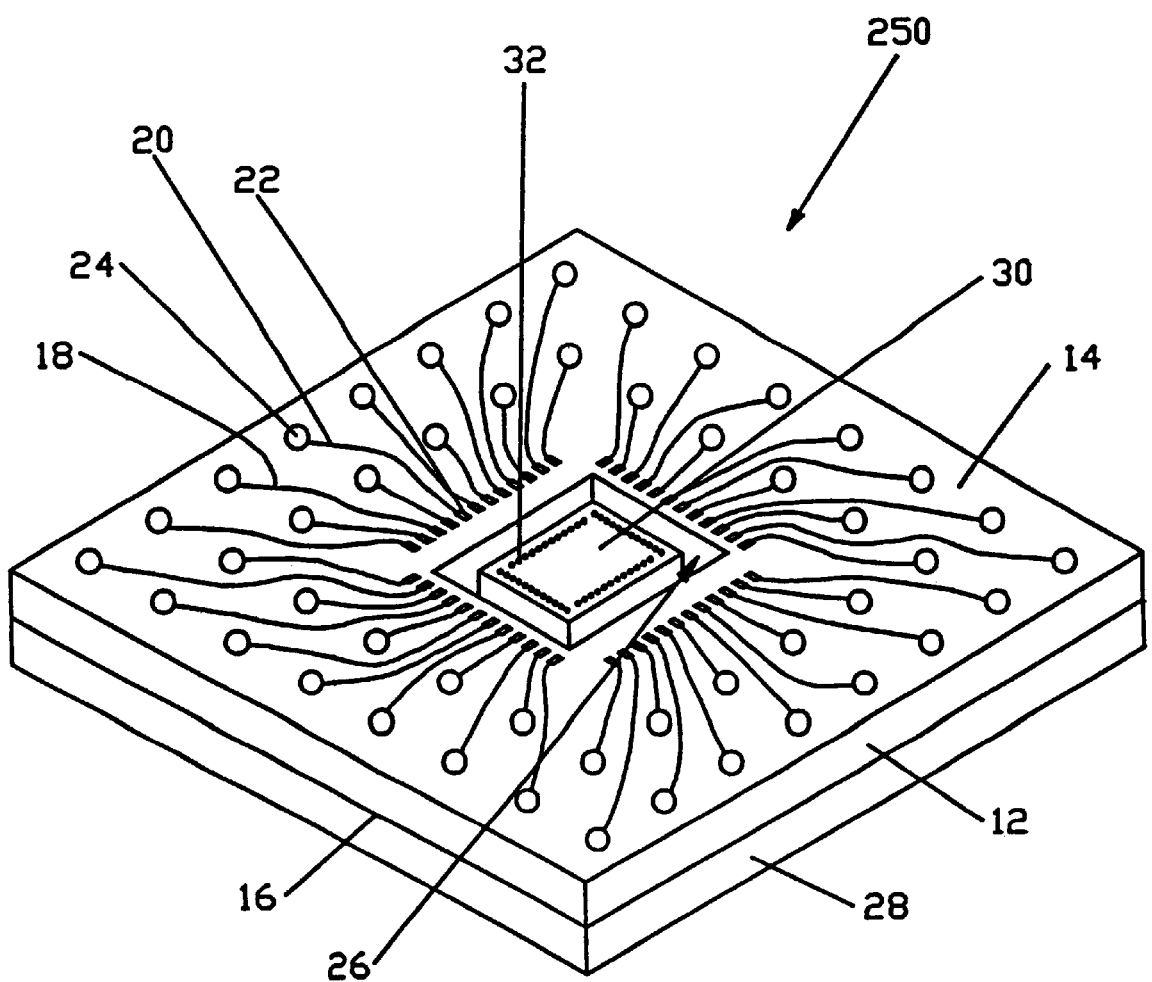
Figure 8:
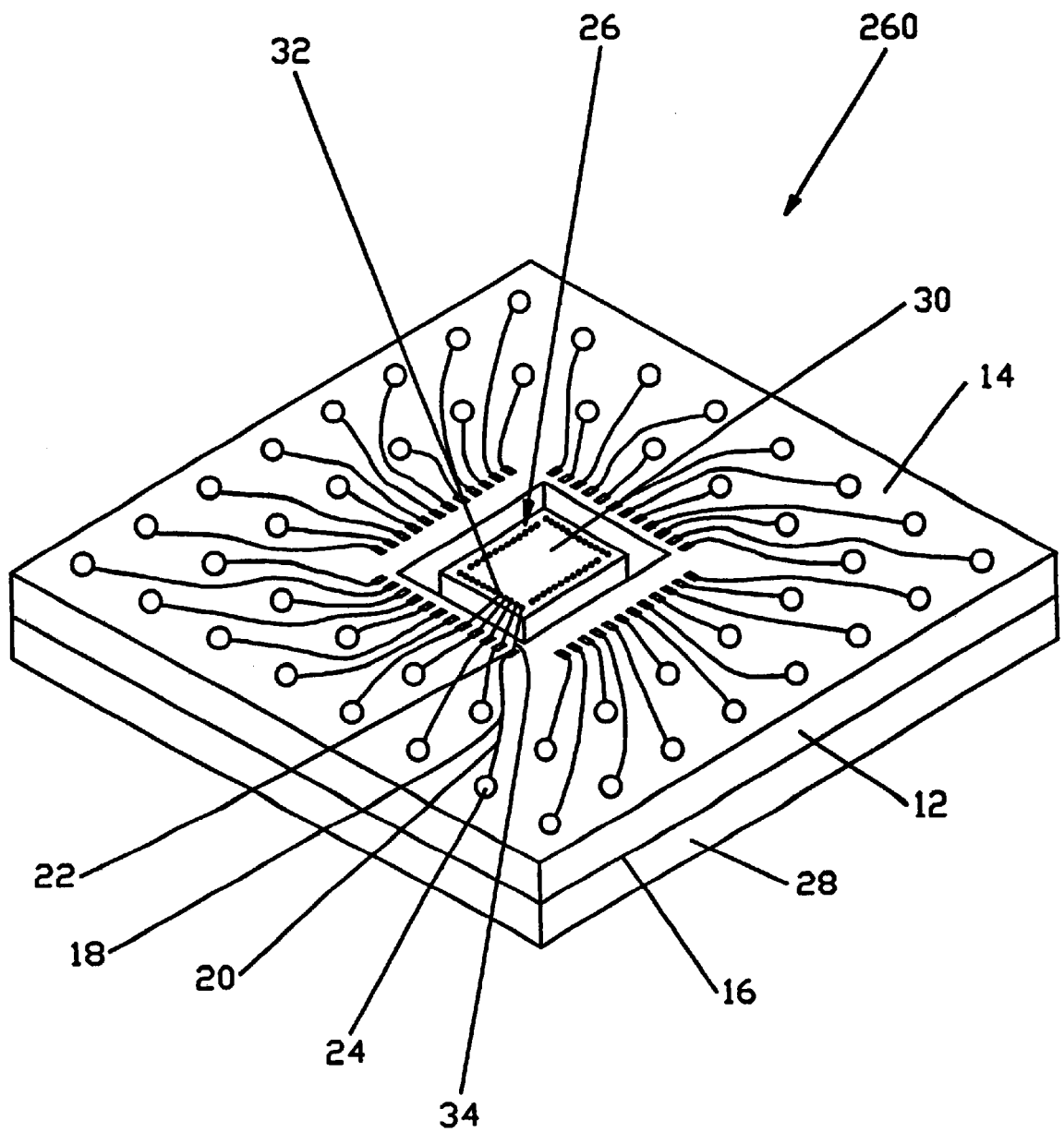

Referring to FIG. 5, step 230 includes punching opening 26 in substrate 12. In step 240, thermally conductive member 28 is secured to second surface 16 of substrate 12 using a thermal resistive adhesive or glue. In step 250, as illustrated in FIG. 7, electronic device 30 is secured to thermally conductive member 28 using a thermally conductive adhesive or glue such that electronic device 30 is positioned within opening 32 in substrate 12. In step 260 (FIG. 8), wire bonds 34 are electrically coupled at a first end to contacts 32 of electronic device 30 and at an opposite end to wire bond pads 22 by a wire bonding process as is well known in the art.

Figure 9:
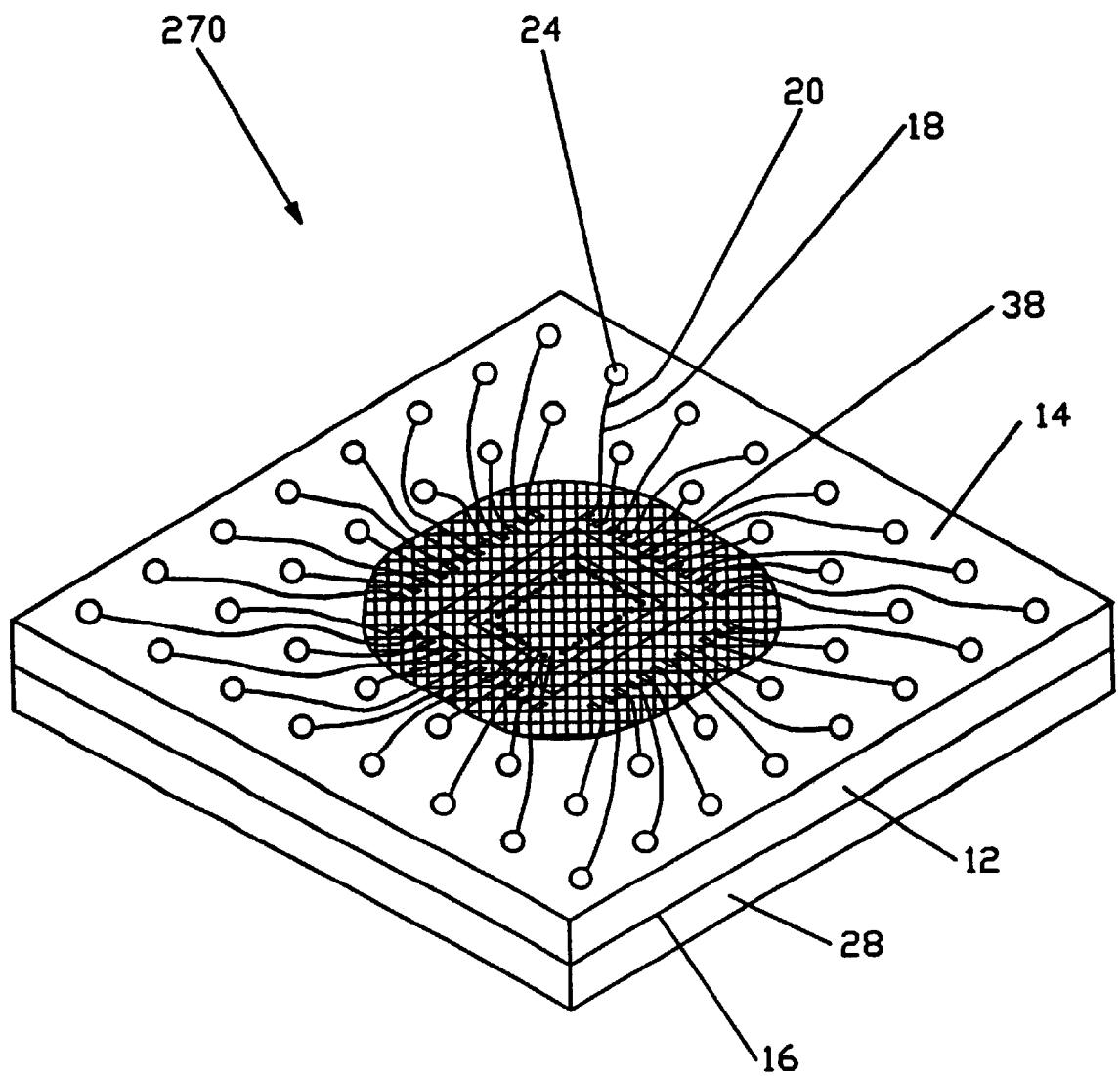
Figure 10:
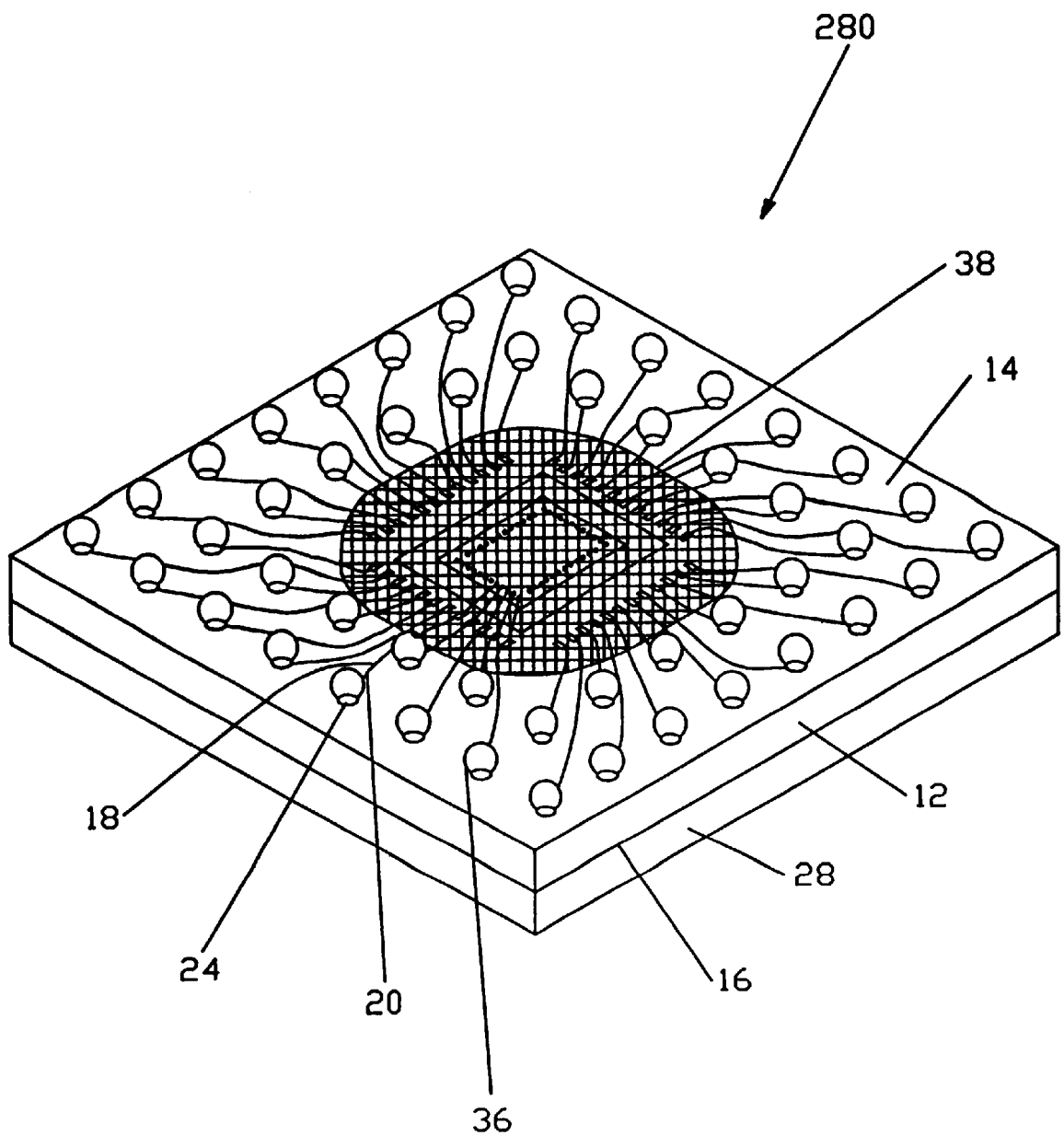

FIG. 9 illustrates step 270, wherein electronic device 30, wire bonds 34, opening 26, and wire bond pads 22 are encapsulated with an electrically insulating material such as epoxy. In step 280, illustrated in FIG. 10, a solder ball is formed on each solder ball pad 24.

Although the present invention and its advantages have been described in detail, it should be understood that various changes, substitutions and alterations can be made herein without departing from the spirit or scope of the invention as defined in the appended claims.

What is claimed is:

1. A method of packaging an electronic device, comprising the steps of:

providing a substrate comprising a laminate containing reinforcing material and having a first surface and an opposed second surface;

forming a single layer of electrically conductive circuitry on the first surface of the substrate by vacuum metallization and wherein said single layer is less than 0.5 mil thickness and includes conductive trace lines having a width less than 1 mil; and wherein said substrate is free of through holes or vias for interconnections for the single layer of electrically conductive circuitry;

providing an opening in the substrate for receiving the electronic device;

securing a thermally conductive member to a second surface of the substrate;

securing the electronic device to the thermally conductive member such that the electronic device is positioned within the opening in the substrate; and electrically coupling the electronic device to wire bond pads located on said first surface.

2. The method as in claim 1 wherein the step of forming includes a step of depositing additional electrically conductive material using an electroplating process to increase a thickness of a electrically conductive material deposited by the vacuum metallization process to less than 0.5 mils.

3. The method as in claims 1 or 2, wherein the step of forming includes a step of removing sections of the electrically conductive material to form trace lines, solder ball pads, and wire bond pads.

4. The method as in claim 1, wherein the step of forming includes a steps of sputtering a first Cr deposit on the first surface, sputtering a Cu deposit over the first Cr deposit, and sputtering a second Cr deposit over the Cu deposit to form a single integral Cr/Cu/Cr layer on the first surface.

5. The method as in clam 1, wherein the step of providing a substrate includes a step of providing a substrate made of an organic material.

6. The method as in claim 1, wherein the step of providing a substrate a the step of providing a substrate formed of a polyimide material.

7. The method as in claim 1, wherein the step of providing an opening includes a step of providing the opening by punching.

8. The method as in claim 1, wherein the step of securing a thermally conductive member includes a step of securing the thermally conductive member to the second surface of the substrate by using an adhesive.

9. The method as in claim 1, wherein the step of securing the electronic device includes a step of securing the electronic device to the thermally conductive member by using an adhesive.

10. The method as in claim 1, wherein the step of electrically coupling includes a step of electrically coupling the electronic device to the layer of circuitry by wire bonding.

11. The method as in claim 1, further including a step of forming a solder ball on each solder ball pad.

12. The method as in claim 1, further a the step of encapsulating the electronic device with an electrically insulating material.

13. The method as in claim 1, wherein the step of providing a substrate includes a step of providing a substrate ranging width of 15 mm to 50 mm by length of 15 mm to 50 mm in size.

14. The method as in claim 13, wherein the step of forming a single layer includes a step of forming more than 100 trace lines.

15. The method of claim 1 wherein said reinforcing material comprises glass cloth.

16. The method of claim 5 wherein said organic material is selected from the group consisting of polyamide, epoxy, and cyanate.

17. The method of claim 1 wherein the surface of said thermally conductive member that is secured to said second surface is planar.

18. The method of claim 1 wherein said laminate is about 15 mils thick.

19. The method of claim 1 wherein spacing between trace lines is 1 mil.

* * * * *

UNITED STATES PATENT AND TRADEMARK OFFICE
CERTIFICATE OF CORRECTION

PATENT NO.   : 5,966,803
DATED        : Oct. 19, 1999
INVENTOR(S)  : James W. Wilson It is certified that error appears in the above-indentified patent and that said Letters Patent is hereby corrected as shown below:

Column 5, line 5, should read --a substrate includes a [the] step of--.
Column 6, line 1, should read --The method as in claim 1, further including a [the] step of--.

Signed and Sealed this

First Day of August, 2000

Q. TODD DICKINSON

Attest:

Attesting Officer

Director of Patents and Trademarks